(12) United States Patent
Chen

(10) Patent No.: US 7,649,919 B2
(45) Date of Patent: Jan. 19, 2010

(54) AUTOMATIC POWER CONTROL CIRCUITS AND METHODS

(75) Inventor: Chien-Ming Chen, Hsin-Chu (TW)

(73) Assignee: MediaTek Inc., Hsin-Chu Hsien (TW)

( * ) Notice: Subject to any disclaimer, the term of this patent is extended or adjusted under 35 U.S.C. 154(b) by 0 days.

(21) Appl. No.: 11/420,481

(22) Filed: May 26, 2006

(65) Prior Publication Data
US 2007/0274356 A1    Nov. 29, 2007

(51) Int. Cl.
*H01S 3/13* (2006.01)
(52) U.S. Cl. .................. 372/29.011; 372/29.01
(58) Field of Classification Search ............ 372/29.011, 372/29.01
See application file for complete search history.

(56) References Cited

U.S. PATENT DOCUMENTS

| | | | | |
|---|---|---|---|---|
| 4,806,800 A | * | 2/1989 | Khan | ............... 326/78 |
| 5,229,662 A | * | 7/1993 | Truong et al. | ........... 326/80 |
| 5,262,705 A | * | 11/1993 | Hattori | ............ 318/479 |
| 6,229,833 B1 | * | 5/2001 | Noda et al. | ........ 372/38.09 |
| 6,842,469 B2 | * | 1/2005 | Nagara | ........... 372/38.02 |
| 6,888,861 B2 | * | 5/2005 | Taguchi et al. | ........ 372/38.1 |

* cited by examiner

*Primary Examiner*—Minsun Harvey
*Assistant Examiner*—Kinam Park
(74) *Attorney, Agent, or Firm*—Winston Hsu

(57) ABSTRACT

An automatic power control (APC) circuit applicable to controlling a laser generation module including a laser generator for generating laser and a photosensor for outputting a detection result corresponding to the power of the laser, includes: a comparator, coupled to the photosensor and biased by a first voltage level, for comparing the detection result and a reference signal to generate a comparison result; a level shifter, coupled the comparator, for shifting an intermediate voltage level controlled by the comparison result to generate a control voltage; and a driver, coupled to the level shifter and the laser generator, for driving the laser generator according to the control voltage and a second voltage level.

25 Claims, 2 Drawing Sheets

AUTOMATIC POWER CONTROL CIRCUITS AND METHODS

BACKGROUND

The present invention relates to laser power control, and more particularly, to automatic power control (APC) circuits and methods.

Within an optical storage device such as a compact disc (CD) drive or a digital versatile disc (DVD) drive, a laser generation module for generating laser is utilized to implement an optical pickup (OPU) therein, where the laser generation module typically comprises a laser generator such as a laser diode (LD), whose laser power is controlled by the magnitude of a current inputted into a control terminal of the LD. Typically, a feedback-loop circuitry is utilized for maintaining the laser power to be substantially constant.

SUMMARY

It is an objective of the claimed invention to provide automatic power control (APC) circuits and methods for laser power control.

An exemplary embodiment of an APC circuit applicable to controlling a laser generation module comprising a laser generator for generating laser and a photosensor for outputting a detection result corresponding to the power of the laser, comprises: a comparator, coupled to the photosensor and biased by a first voltage level, for comparing the detection result and a reference signal to generate a comparison result; a level shifter, coupled the comparator, for shifting an intermediate voltage level controlled by the comparison result to generate a control voltage; and a driver, coupled to the level shifter and the laser generator, for driving the laser generator according to the control voltage and a second voltage level.

An exemplary embodiment of an APC method applicable to controlling a laser generation module comprising a laser generator for generating laser and a photosensor for outputting a detection result corresponding to the power of the laser, comprises: comparing the detection result and a reference signal to generate a comparison result by utilizing a first voltage level as a biasing voltage; shifting an intermediate voltage level controlled by the comparison result to generate a control voltage; and driving the laser generator according to the control voltage by utilizing a second voltage level.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
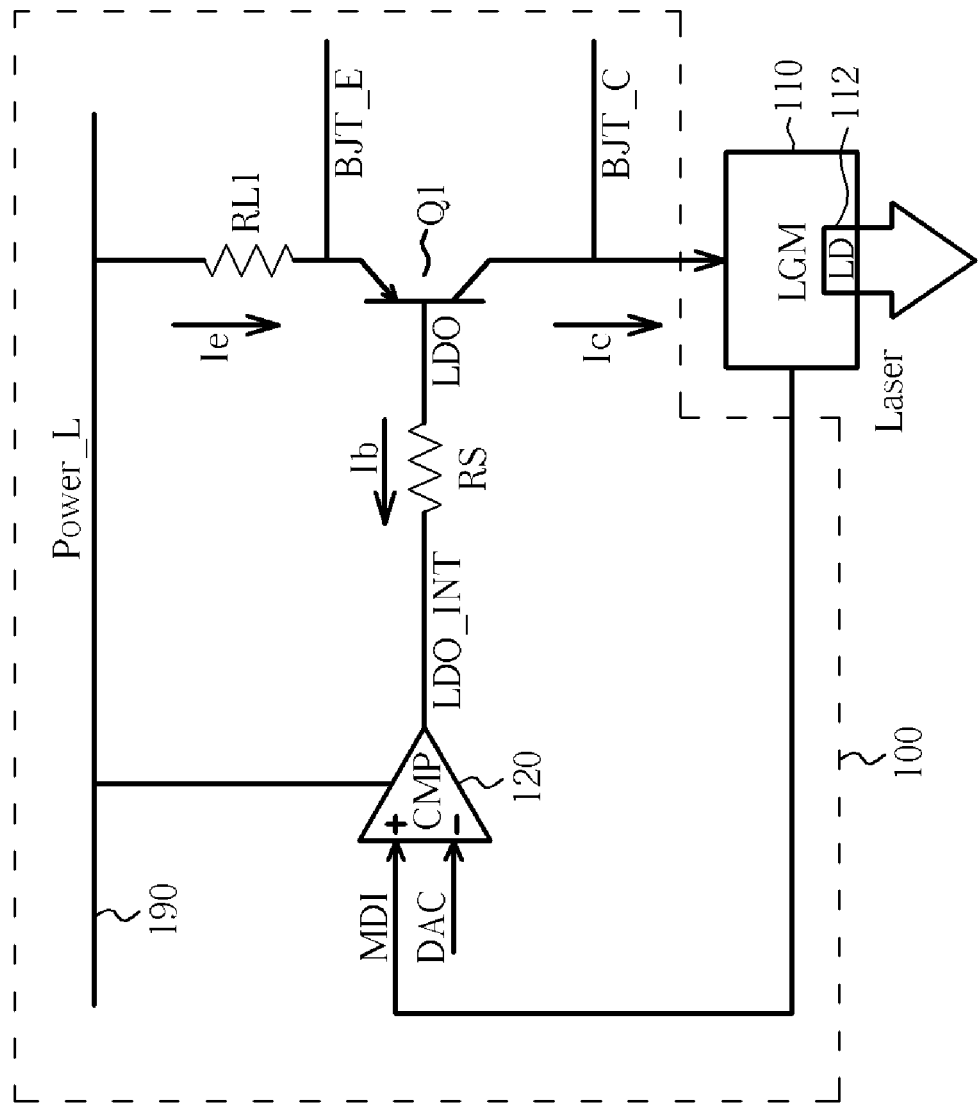
FIG. 1 is a diagram of an automatic power control (APC) circuit according to one embodiment of the present invention.

Please refer to FIG. 1 illustrating an automatic power control (APC) circuit 100 applicable to controlling a laser generation module (LGM) 110 according to a first embodiment of the present invention. The LGM 110 comprises a laser generator for generating laser, where the laser generator is a laser diode (LD) 112 in this embodiment. The LGM 110 further comprises a photosensor (not shown) for outputting a detection result MDI corresponding to the power of the laser (i.e., the laser power). Typically, the LD 112 and the photosensor mentioned above are integrated into a single module.

The APC circuit 100 comprises a power line 190 for outputting power with a voltage level Power_L such as 3.3 V that is typically utilized in a microchip. As shown in FIG. 1, the APC circuit 100 further comprises a comparator 120 coupled to the power line 190 and the photosensor of the LGM 110, a resistor RS coupled to the comparator 120, and a driver, where the driver comprises a resistor RL1 coupled to the power line 190, and further comprises a transistor Q1 having a control terminal coupled to the resistor RS and two output terminals (BJT_C and BJT_E) respectively coupled to the LD 112 and the resistor RL1. According to this embodiment, the transistor Q1 is a bipolar junction transistor (BJT), whose emitter, base, and collector are respectively coupled to the resistor RL1, the resistors RS, and the LD 112.

The comparator 120 compares the detection result MDI and a reference signal DAC to generate a comparison result LDO_INT. Here, a digital-to-analog converter (not shown) is typically utilized for converting a target value stored in a control register into the reference signal DAC. If a voltage level of the detection result MDI is greater than a voltage level of the reference signal DAC, the comparison result LDO_INT is at a high level; otherwise, the comparison result LDO_INT is at a low level. The resistor RS converts the comparison result LDO_INT into an intermediate voltage level LDO, and the intermediate voltage level LDO controlled by the comparison result LDO_INT adjusts an operation point of the transistor Q1, in order to maintain the laser power to be substantially constant. As a result of the closed loop circuitry shown in FIG. 1, the target value mentioned above can be utilized for determining the magnitude of the laser power.

Regarding a temperature characteristic of the LD 112, the higher the temperature, the more current Ic from the collector to the LD 112 is required in order to maintain the same laser power. In this situation, the intermediate voltage level LDO and the voltage level at the terminal BJT_E decrease due to greater voltage drop across the resistor RL1 since Ie=Ib+Ic and Ib is minor in contrast to Ie and Ib. However, the more current Ic is injected from the collector into the LD 112, the higher the voltage at the terminal BJT_C. As a result of the temperature characteristic of the LD 112, the transistor Q1 would probably reach a saturation region thereof while the laser power has not reached a predetermined value corresponding to the target value mentioned above, causing inability to operate at high temperature.

Figure 2:
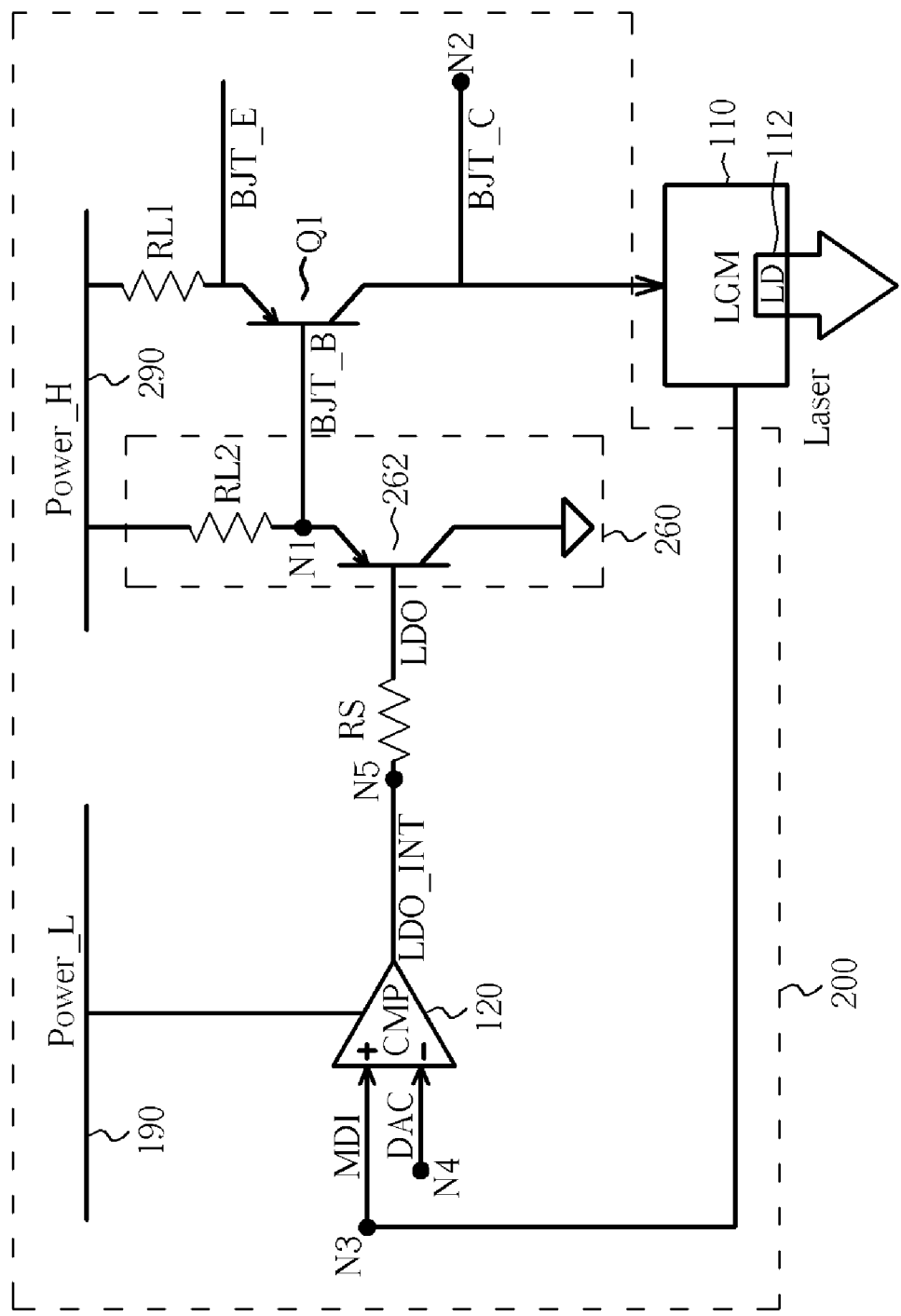
FIG. 2 is a diagram of an APC circuit according to another embodiment of the present invention.

Please refer to FIG. 2 illustrating an APC circuit 200 applicable to the LGM 110 according to a second embodiment of the present invention, where the temperature characteristic of the LD 112 can be overcome.

In this embodiment, the driver is coupled between node N1 and node N2. A first input (i.e. MDI) of the comparator 120 is coupled to node N3 and a second input (i.e. DAC) is coupled to node N4. An output of the comparator 120 is coupled to node N5.

In addition to the comparator 120, the resistor RS, the driver comprising the resistor RL1 and the transistor Q1, and the power line 190, the APC circuit 200 further comprises a level shifter 260 and a power line 290, where the level shifter 260 comprises a transistor 262 and a resistor RL2, and the power line 290 outputs power with a voltage level Power_H such as 5 V.

According to this embodiment, the transistor 262 is also a BJT, whose emitter, base, and collector are respectively coupled to the resistor RL2, the resistor RS, and a predetermined voltage level such as ground voltage. The node N1 between the resistor RL2 and the emitter of the transistor 262 is utilized as an output terminal of the level shifter 260, for coupling to the control terminal BJT_B (i.e., the base of the transistor Q1) of the driver. Additionally, the base of the transistor 262 is utilized as a control terminal of the level shifter 262, and receives the intermediate voltage level LDO. The level shifter shifts the intermediate voltage level LDO controlled by the comparison result LDO_INT to generate a control voltage, which is outputted to the control terminal BJT_B of the driver. As shown in FIG. 2, the driver comprises the transistor Q1 and the resistor RL1. The driver drives the LD 112 according to the control voltage at the control terminal BJT_B and according to the voltage level Power_H of the power line 290.

As the gain provided by the level shifter 260 is substantially equal to one, the loop gain of the APC circuit 200 is substantially equal to the loop gain of the APC circuit 100. In addition, while replacing the APC circuit 100 with the APC circuit 200, the voltage level Power_H is utilized for increasing emitter-voltage and the base-voltage of the transistor Q1. As a result, the transistor Q1 may continue operating at a linear region thereof, regardless of the temperature characteristic of the LD 112.

The invention has at least the following advantages. The voltage level Power_H can increase the range of linearity when the APC circuit 200 is operated. The level shifter 260 provides a connection between a low voltage domain (i.e. the Power_L domain) and a high voltage domain (i.e. the Power_H domain). The level shifter 260 allows the circuit operated in the low voltage domain and the circuit operated in the high voltage domain to be successfully connected and to function well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An automatic power control (APC) circuit applicable to controlling a laser generation module, the laser generation module comprising a laser generator for generating laser and a photosensor for outputting a detection result corresponding to the power of the laser, the APC circuit comprising:
    a comparator, coupled to the photosensor and biased by a first voltage level, for comparing the detection result and a reference signal to generate a comparison result, wherein the comparator is not biased by a second voltage level, and the first voltage level is a maximum voltage level applied to the comparator;
    a level shifter, coupled to the comparator, for shifting an intermediate voltage level controlled by the comparison result to generate a control voltage, wherein the level shifter is not biased by the first voltage level; and
    a driver, coupled to the level shifter and the laser generator, for driving the laser generator according to the control voltage and the second voltage level, wherein the second voltage level is a maximum voltage level applied to the driver.

2. The APC circuit of claim 1, wherein the second voltage level is higher than the first voltage level, and the first voltage level and the second voltage level are positive voltage levels, respectively.

3. The APC circuit of claim 1, wherein the level shifter comprises:
    a transistor having a control terminal coupled to the comparator and an output terminal coupled to the driver for generating the control voltage according to the intermediate voltage level inputted into the control terminal; and
    a resistor, coupled between the second voltage level and the output terminal of the transistor.

4. The APC circuit of claim 3, wherein the transistor is a bipolar junction transistor (BJT), the control terminal is a base of the BJT, and the output terminal is an emitter of the BJT.

5. The APC circuit of claim 1, wherein the driver comprises:
    a transistor having a control terminal coupled to the level shifter and a first output terminal coupled to the laser generator for driving the laser generator according to the control voltage inputted into the control terminal; and
    a resistor, coupled between the second voltage level and a second output terminal of the transistor.

6. The APC circuit of claim 5, wherein the transistor is a bipolar junction transistor (BJT), the control terminal is a base of the BJT, the first output terminal is a collector of the BJT, and the second output terminal is an emitter of the BJT.

7. The APC circuit of claim 1, further comprising:
    a resistor, coupled between the comparator and the level shifter, for converting the comparison result into the intermediate voltage level.

8. The APC circuit of claim 1, wherein the laser generator is a laser diode.

9. An automatic power control (APC) method applicable to controlling a laser generation module, the laser generation module comprising a laser generator for generating laser and a photosensor for outputting a detection result corresponding to the power of the laser, the APC method comprising:
    comparing the detection result and a reference signal to generate a comparison result by utilizing a first voltage level as a biasing voltage, rather than by utilizing a second voltage level as the biasing voltage, wherein the first voltage level is a maximum voltage level utilized for comparing the detection result and the reference signal;
    shifting an intermediate voltage level controlled by the comparison result to generate a control voltage without utilizing the first voltage level as a biasing voltage for shifting the intermediate voltage level; and
    driving the laser generator according to the control voltage by utilizing the second voltage level, wherein the second voltage level is a maximum voltage level utilized for driving the laser generator.

10. The APC method of claim 9, wherein the second voltage level is higher than the first voltage level, and the first voltage level and the second voltage level are positive voltage levels, respectively.

11. The APC method of claim 9, further comprising:
    providing a level shifter for shifting the intermediate voltage level to generate the control voltage, the level shifter comprising:
        a transistor having a control terminal and an output terminal for generating the control voltage according to the intermediate voltage level inputted into the control terminal; and
        a resistor, coupled between the second voltage level and the output terminal of the transistor.

12. The APC method of claim 11, wherein the transistor is a bipolar junction transistor (BJT), the control terminal is a base of the BJT, and the output terminal is an emitter of the BJT.

13. The APC method of claim 9, further comprising:
    providing a driver for driving the laser generator according to the control voltage, the driver comprising:

a transistor having a control terminal and a first output terminal coupled to the laser generator for driving the laser generator according to the control voltage inputted into the control terminal; and a resistor, coupled between the second voltage level and a second output terminal of the transistor.

14. The APC method of claim 13, wherein the transistor is a bipolar junction transistor (BJT), the control terminal is a base of the BJT, the first output terminal is a collector of the BJT, and the second output terminal is an emitter of the BJT.

15. The APC method of claim 9, further comprising:
converting the comparison result into the intermediate voltage level.

16. A circuit, comprising:
a driver coupled between a first node N1 and a second node N2, the driver being biased by a first voltage level, the driver driving a laser generator according to a voltage on the first node N1, wherein the first voltage level is a maximum voltage level applied to the driver;

a comparator comprising a first input coupled to a third node N3, a second input coupled to a fourth node N4, and an output coupled to a fifth node N5, the comparator being biased by a second voltage level, the second voltage level being lower than the first voltage level, the comparator receiving a laser power signal via the third node N3 and a reference signal via the fourth node N4, the laser power signal indicating a laser power of the laser generator, the comparator comparing the laser power signal with the reference signal to generate a comparison result at the fifth node N5, wherein the comparator is not biased by the first voltage level, and the second voltage level is a maximum voltage level applied to the comparator;

a resistor, coupled between the fifth node N5 and a sixth node, for converting the comparison result into an intermediate voltage level, wherein the intermediate voltage level is a voltage level at the sixth node; and a level shifter coupled between the first node N1 and the sixth node, the level shifter providing a voltage drop between the first node N1 and the sixth node, wherein the level shifter is not biased by the second voltage level.

17. An automatic power control (APC) circuit applicable to controlling a laser generation module, the laser generation module comprising a laser generator for generating laser and a photosensor for outputting a detection result corresponding to the power of the laser, the APC circuit comprising:
a comparator, coupled to the photosensor and biased by a first voltage level, for comparing the detection result and a reference signal to generate a comparison result, wherein the comparator is not biased by a second voltage level, and the first voltage level is a maximum voltage level applied to the comparator;

a resistor, coupled between the comparator and the level shifter, for converting the comparison result into an intermediate voltage level;

a level shifter, coupled to the comparator through the resistor, for shifting the intermediate voltage level controlled by the comparison result to generate a control voltage, wherein the level shifter is not biased by the first voltage level; and a driver, coupled to the level shifter and the laser generator, for driving the laser generator according to the control voltage and the second voltage level, wherein the second voltage level is a maximum voltage level applied to the driver.

18. The APC circuit of claim 17, wherein the second voltage level is higher than the first voltage level.

19. The APC circuit of claim 17, wherein the level shifter comprises:
a transistor having a control terminal coupled to the comparator and an output terminal coupled to the driver for generating the control voltage according to the intermediate voltage level inputted into the control terminal; and a resistor, coupled between the second voltage level and the output terminal of the transistor.

20. The APC circuit of claim 19, wherein the transistor is a bipolar junction transistor (BJT), the control terminal is a base of the BJT, and the output terminal is an emitter of the BJT.

21. An automatic power control (APC) method applicable to controlling a laser generation module, the laser generation module comprising a laser generator for generating laser and a photosensor for outputting a detection result corresponding to the power of the laser, the APC method comprising:
comparing the detection result and a reference signal to generate a comparison result by utilizing a first voltage level as a biasing voltage, rather than by utilizing a second voltage level as the biasing voltage, wherein the first voltage level is a maximum voltage level utilized for comparing the detection result and the reference signal;

converting the comparison result into an intermediate voltage level;

shifting the intermediate voltage level controlled by the comparison result to generate a control voltage without utilizing the first voltage level as a biasing voltage for shifting the intermediate voltage level; and driving the laser generator according to the control voltage by utilizing the second voltage level, wherein the second voltage level is a maximum voltage level utilized for driving the laser generator.

22. The APC method of claim 21, wherein the second voltage level is higher than the first voltage level.

23. The APC method of claim 21, further comprising:
providing a level shifter for shifting the intermediate voltage level to generate the control voltage, the level shifter comprising:
a transistor having a control terminal and an output terminal for generating the control voltage according to the intermediate voltage level inputted into the control terminal; and a resistor, coupled between the second voltage level and the output terminal of the transistor.

24. The APC method of claim 23, wherein the transistor is a bipolar junction transistor (BJT), the control terminal is a base of the BJT, and the output terminal is an emitter of the BJT.

25. The APC method of claim 21, further comprising:
providing a resistor for converting the comparison result into an intermediate voltage level.

* * * * *

UNITED STATES PATENT AND TRADEMARK OFFICE
CERTIFICATE OF CORRECTION

| | | |
|---|---|---|
| PATENT NO. | : 7,649,919 B2 | Page 1 of 1 |
| APPLICATION NO. | : 11/420481 | |
| DATED | : January 19, 2010 | |
| INVENTOR(S) | : Chien-Ming Chen | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 11 days.

Signed and Sealed this

Twenty-eighth Day of December, 2010

David J. Kappos
*Director of the United States Patent and Trademark Office*